United States Patent
Zhang

(10) Patent No.: US 7,355,407 B1
(45) Date of Patent: Apr. 8, 2008

(54) METHODS AND APPARATUS FOR SINGLE-SHOT MAGNETIC RESONANCE IMAGING WITH OPTIMIZED ISOTROPIC DIFFUSION WEIGHTING

(75) Inventor: Weiguo Zhang, Foster City, CA (US)

(73) Assignee: Toshiba Medical Systems Corp., Otawara-shi (JP)

( * ) Notice: Subject to any disclaimer, the term of this patent is extended or adjusted under 35 U.S.C. 154(b) by 0 days.

(21) Appl. No.: 11/566,225

(22) Filed: Dec. 3, 2006

(51) Int. Cl.
  *G01V 3/00* (2006.01)
(52) U.S. Cl. ......... 324/309; 324/318
(58) Field of Classification Search ........ 324/300–322; 600/407–455
  See application file for complete search history.

(56) References Cited

U.S. PATENT DOCUMENTS

| | | | |
|---|---|---|---|
| 5,833,609 A * | 11/1998 | Dannels et al. ........... | 600/410 |
| 6,160,397 A * | 12/2000 | Washburn et al. ......... | 324/309 |
| 6,265,872 B1 * | 7/2001 | Heid ......................... | 324/307 |
| 6,288,540 B1 * | 9/2001 | Chen et al. ................ | 324/300 |
| 6,806,705 B2 * | 10/2004 | van Muiswinkel et al. . | 324/307 |
| 6,842,000 B2 * | 1/2005 | Norris et al. .............. | 324/309 |
| 6,969,991 B2 * | 11/2005 | Bammer et al. ........... | 324/307 |
| 6,992,484 B2 * | 1/2006 | Frank ........................ | 324/307 |

* cited by examiner

*Primary Examiner*—Brij B. Shrivastav
(74) *Attorney, Agent, or Firm*—Stephen B. Parker; Watchstone P+D, pllc

(57) ABSTRACT

For isotropic diffusion weighting during magnetic resonance imaging, a motion-probing magnetic field gradient pattern is manufactured from a template by searching for an optimum value of a skew parameter ($\epsilon$) of the template. The gradient pattern includes a first pattern before at least one RF refocusing pulse and a second pattern after the refocusing pulse in which the second pattern is symmetrical with the first pattern. For example, gradient coils produce a respective gradient component along each of three orthogonal directions, and for each component and each pattern, the gradient pattern has one cycle of opposite polarity lobes about a crossing point, and for each pattern, the crossing point of the cycle in one of the orthogonal directions is a midpoint of the cycle; and the skew parameter ($\epsilon$) specifies a difference in time between the crossing points of the cycles in the other orthogonal directions.

20 Claims, 7 Drawing Sheets

METHODS AND APPARATUS FOR SINGLE-SHOT MAGNETIC RESONANCE IMAGING WITH OPTIMIZED ISOTROPIC DIFFUSION WEIGHTING

BACKGROUND

1. Field of the Invention

The present invention relates generally to magnetic resonance imaging, and specifically to using motion-probing gradient pulses selected for isotropic diffusion weighting.

2. Background Discussion

Magnetic Resonance Imaging (MRI) is a widely accepted and commercially available technique for obtaining digitized visual images representing the internal structure of objects (such as the human body) having substantial populations of atomic nuclei that are susceptible to nuclear magnetic resonance (NMR). In MRI, imposing a strong main magnetic field ($B_0$) on the nuclei polarizes nuclei in the volume of an object to be imaged. The nuclei are excited by a radio frequency (RF) signal at characteristic NMR (Larmor) frequencies. By spatially distorting localized magnetic fields surrounding the object and analyzing the resulting RF responses from the nuclei, a map or image of these responses as a function of their spatial location can be generated and displayed. An image of the nuclear responses provides a non-invasive view of an object's internal structures and of other properties.

It has been long known that by using motion-probing gradient (MPG) pulses, magnetic resonance (MR) images can be acquired with contrast sensitive to molecular self-diffusion. See, for example, Stejskal E, Tanner J, *Spin diffusion measurements: spin echoes in the presence of time-dependent field gradient*, J Chem Phys 42:288-292 (1965); Le Bihan D, Breton E, Lallemand D, Grenier P. Cabanis E, Laval-Jeantet M, *MR imaging of introvoxel incoherent motions: application to diffusion and perfusion in neurologic disorders*, Radiology 161:401-407 (1986).

In biological tissues, diffusion is in general anisotropic. By acquiring multiple data sets with varied MPG gradient direction and strength, diffusion anisotropy of water molecules in biological systems has been measured, imaged and used for study of some important pathophysiological properties, such as tissue fiber orientation. See, for example, Basser P J, Mattiello J, Le Bihan D, *MR diffusion tensor spectroscopy and imaging*, Biophys J 66:259-267 (1994); Xue R, van Zijl P C, Crain B J, Solaiyappan M, Mori S, *In vivo three-dimensional reconstruction of rat brain axonal projections by diffusion tensor imaging*, Magn Reson Med 42: 1123-1127 (1999). However, in many other cases, such as for diagnosis of stroke, strong anisotropy may instead impair the diagnosis by masking the underlying changes in the local apparent diffusion coefficient, which was found to be a better indicator for early detection of stroke. See, for example, Moseley M E, Cohen Y, Mintorovitch J, Chileuitt L, Shimizu H. Ducharczyk J, Wnedland M F, Weinstein P R, *Early detection of regional cerebral ischemia in cats: comparison of diffusion- and T2-weighted MRI and spectroscopy*, Magn Reson Med 14:330-346 (1990). For such applications weighting by the trace of the diffusion tensor, a.k.a. isotropic diffusion weighting, is preferable instead.

Isotropic diffusion weighting is usually achieved by combining multiple data sets from separate measurements with diffusion weighting in different directions. The simplest of these is to perform three separate measurements with diffusion weighting along three orthogonal directions in a laboratory reference frame. The images are combined to generate isotropic diffusion weighting. A problem encountered while using this approach is the long acquisition time needed in order to collect the required multiple data sets.

Recently, methods have been developed for acquiring images with isotropic diffusion weighting in a single shot. For example, an approach by Mori et al. uses combinations of bipolar gradients; as many as twelve pairs. See Mori S, van Zijl PCM, *Diffusion weighting by the trace of the diffusion tensor within a single scan*, Magn Reson Med 33.41-52 (1995) This approach, though simple to implement, is unfortunately very inefficient in producing diffusion weighting. If we define the efficiency as a ratio between the b value generated by the new gradient pattern to that by a simple pair of bipolar gradient pulses, the highest efficiency reported by this approach is about 0.188. This translates to need for increase in gradient by 230%

$$\left(\sqrt{\frac{1}{0.188}}\right)$$

or lengthening of diffusion weighting time by 170%

$$\left(\sqrt[3]{\frac{1}{0.188}}\right)$$

in order to achieve the same diffusion weighting. Even using an optimized orthogonal gradient scheme, the highest efficiency achieved by the approach is only 0.25. See Chen, Z, Zhong, J, Optimized Orthogonal Gradient Technique For Fast Quantitative Diffusion MRI On A Clinical Scanner, U.S. Pat. No. 6,288,540 B1 (2001).

On the other hand, an approach by Wong et al. uses numerical techniques to manufacture gradient patterns that yield isotropic gradient weighting. See Wong E C, Cox R W, Song A W, *Optimized isotropic diffusion weighting: Magn Reson Med* 34:139-143 (1995). The advantage of their approach is that much higher efficiency for diffusion weighting can be achieved. The disadvantages are (1) the procedures used for manufacturing the gradient patterns are complex and require a lot of computation power; (2) the gradient patterns can only be applied in sequences with the exact same parameters assumed when the patterns are manufactured. When the sequence parameters are changed or when new sequences are used, the gradient patterns used need to be re-manufactured. Applying a complex procedure that demands high computational power on the fly is difficult in practice and may be entirely impractical.

There is, therefore, a great need for simple and efficient methods and procedures for manufacturing gradient patterns. Such procedures are to be used on the fly with real parameters used by the imaging sequence to produce gradient patterns with desired characteristics. The gradient patterns so generated should be easy to implement on any commercially available MR scanners with good efficiency for isotropic diffusion weighting.

SUMMARY

In accordance with one aspect, the present invention provides a method of magnetic resonance imaging of an object. The method includes placing the object in a magnetic bias field and applying radio-frequency (RF) excitation to the object to excite nuclear spins in the object, and then applying a first motion-probing magnetic field gradient pattern to the object, and then applying at least one radio-frequency (RF) refocusing pulse to the object to refocus the excited nuclear spins in the object, and then applying a second motion-probing magnetic field gradient pattern to the object, and then applying an imaging process to spatial-encode and record a magnetic resonance signal from the object for producing a magnetic resonance image of the object, and then producing the magnetic resonance image of the object from the recorded magnetic resonance signal from the object. The second motion-probing magnetic field gradient pattern is symmetrical with respect to the first motion-probing magnetic field gradient pattern, and the first and second motion-probing magnetic field gradient patterns follow a template characterized by a skew parameter ($\epsilon$). The first and second motion-probing magnetic field gradient patterns are selected for single-scan isotropic diffusion weighting by calculating in real time an optimum value of the skew parameter ($\epsilon$) as a function of determined values of other parameters of the imaging sequence in which the motion-probing magnetic field gradient patterns are applied. The process of excitation, isotropic diffusion weighting and signal detection is repeated as many times as required by the imaging process for spatial encoding. The imaging sequence can be any of a variety of kinds, such as conventional spin-echo (SE), stimulated-echo (STE), fast-spin-echo (FSE), spiral scan, or echo planar imaging (EPI).

In accordance with another aspect the present invention provides a method of magnetic resonance imaging of an object. The method includes placing the object in a magnetic bias field and applying radio-frequency (RF) excitation to the object to excite nuclear spins in the object, and then applying a first motion-probing magnetic field gradient pattern to the object, and then applying at least one radio-frequency (RF) refocusing pulse to the object to refocus the excited nuclear spins, and then applying a second motion-probing magnetic field gradient pattern to the object, and then applying an imaging process to spatial-encode and record a magnetic resonance signal from the object for producing a magnetic resonance image of the object, and then producing the magnetic resonance image of the object from the recorded magnetic resonance signal from the object. The first motion-probing magnetic field gradient pattern includes a first component along a first direction, a second component along a second direction, and a third component along a third direction, wherein the first, second, and third directions are orthogonal to each other. The first component of the second motion-probing magnetic field gradient pattern is substantially identical to the first component of the first motion-probing magnetic field gradient pattern shifted in time, the second component of the second motion-probing magnetic field gradient pattern is substantially identical to the second component of the first motion-probing magnetic field gradient pattern inverted in time and shifted in time, and the third component of the second motion-probing magnetic field gradient pattern is substantially identical to the third component of the first motion-probing magnetic field gradient pattern inverted in time and shifted in time. Each component of each of the first and second motion-probing field gradient patterns has a single cycle of two lobes of opposite polarity about a crossing point. Each of the single cycles has substantially the same period, and the crossing point of the first component of the first motion-probing gradient pattern is a mid-point of the single cycle of the first component of the first motion-probing gradient pattern. The method includes adjusting a skew parameter ($\epsilon$) for isotropic diffusion weighting, wherein the skew parameter ($\epsilon$) specifies a time shift of the second component of the first motion-probing gradient pattern towards an earlier time point from the mid-point of the pattern and a time shift of the third component of the first motion-probing gradient pattern towards a later time from the mid-point of the pattern.

In accordance with yet another aspect, the invention provides a system for magnetic resonance imaging of an object. The system includes a magnet for applying a magnetic bias field to the object, at least one radio-frequency (RF) coil for radio-frequency (RF) coupling with the object at a magnetic resonance frequency, gradient coils for applying a first motion-probing magnetic field gradient pattern to the object prior to application of at least one radio-frequency (RF) refocusing pulse to the object and for applying a second motion-probing magnetic field gradient pattern to the object after the application of the at least one radio-frequency (RF) refocusing pulse to the object, a radio-frequency (RF) source and power amplifier connected to the at least one radio-frequency (RF) coil for applying radio-frequency (RF) pulses to the object, a gradient amplifier connected to the gradient coils for exciting the gradient coils, a radio-frequency (RF) amplifier connected to the at least one radio-frequency (RF) coil for amplifying a magnetic resonance signal from magnetic resonance in the object, and a control computer connected to the radio-frequency (RF) source and the gradient amplifier for controlling the radio-frequency (RF) source and the gradient amplifier, and connected to the radio-frequency (RF) amplifier for recording the magnetic resonance signal. The control computer is programmed for computing a magnetic resonance image of the object from the recorded magnetic resonance signal, and for adjusting the motion-probing magnetic field gradient patterns so that the second motion-probing magnetic field gradient pattern is symmetrical with respect to the first motion-probing magnetic field gradient pattern and the first and second motion-probing magnetic field gradient patterns follow a template characterized by a skew parameter ($\epsilon$). The control computer is further programmed for isotropic diffusion weighting by calculating in real time an optimum value of the skew parameter ($\epsilon$) as a function of determined values of other parameters of the imaging sequence in which the motion-probing magnetic field gradients are applied.

In accordance with still another aspect, the invention provides a system for magnetic resonance imaging of an object. The system includes a magnet for applying a magnetic bias field to the object, at least one radio-frequency (RF) coil for radio-frequency (RF) coupling with the object at a magnetic resonance frequency, gradient coils for applying a first motion-probing magnetic field gradient pattern to the object prior to application of at least one radio-frequency (RF) refocusing pulse to the object and for applying a second motion-probing magnetic field gradient pattern to the object after the application of the at least one radio-frequency (RF) refocusing pulse to the object, a radio-frequency (RF) source and power amplifier connected to the at least one radio-frequency (RF) coil for applying radio-frequency (RF) pulses to the object, a gradient amplifier connected to the gradient coils for exciting the gradient coils, a radio-frequency (RF) amplifier connected to the at least one radio-frequency (RF) coil for amplifying a magnetic resonance signal from magnetic resonance in the object, and a control computer connected to the radio-frequency (RF) source and the gradient amplifier for controlling the radio-frequency (RF) source and the gradient amplifier, and connected to the radio-frequency (RF) amplifier for recording the magnetic resonance signal. The control computer is programmed for computing a magnetic resonance image of the object from the recorded magnetic resonance signal, and for adjusting the motion-probing magnetic field gradient patterns so that the first motion-probing magnetic field gradient pattern includes a first component along a first direction, a second component along a second direction, and a third component along a third direction, wherein the first, second, and third directions are orthogonal to each other, and the second motion-probing magnetic field gradient pattern has a first component along the first direction, a second component along the second direction, and a third component along the third direction. The first component of the second motion-probing magnetic field gradient pattern is substantially identical to the first component of the first motion-probing magnetic field gradient pattern shifted in time, the second component of the second motion-probing magnetic field gradient pattern is substantially identical to the second component of the first motion-probing magnetic field gradient pattern inverted in time and shifted in time, and the third component of the second motion-probing magnetic field gradient pattern is substantially identical to the third component of the first motion-probing magnetic field gradient pattern inverted in time and shifted in time. Each component of each of the first and second motion-probing magnetic field gradient patterns has a single cycle of two lobes of opposite polarity about a crossing point. Each of the single cycles has substantially the same period, and the crossing point of the first component of the first motion-probing magnetic field gradient pattern is a mid-point of the single cycle of the first component of the first motion-probing magnetic field gradient pattern. The control computer is programmed for adjusting a skew parameter ($\epsilon$) for isotropic diffusion weighting, wherein the skew parameter ($\epsilon$) specifies a time shift of the second component of the first motion-probing magnetic field gradient pattern toward an earlier time from the mid-point and a time shift of the third component of the first motion-probing magnetic field gradient pattern toward a later time from the mid-point.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/or advantages of particular embodiments should not be construed as limiting other embodiments or the claims.

DESCRIPTION OF THE DRAWINGS

The preferred embodiments of the present invention are shown by way of example, and not limitation, in the accompanying figures in which.

DESCRIPTION OF THE PREFERRED EMBODIMENTS

While the present invention may be embodied in many different forms, illustrative embodiments are described herein with the understanding that the present disclosure is to be considered as providing examples of the principles of the invention and that such examples are not intended to limit the invention to preferred embodiments described herein and/or illustrated herein.

Figure 1:
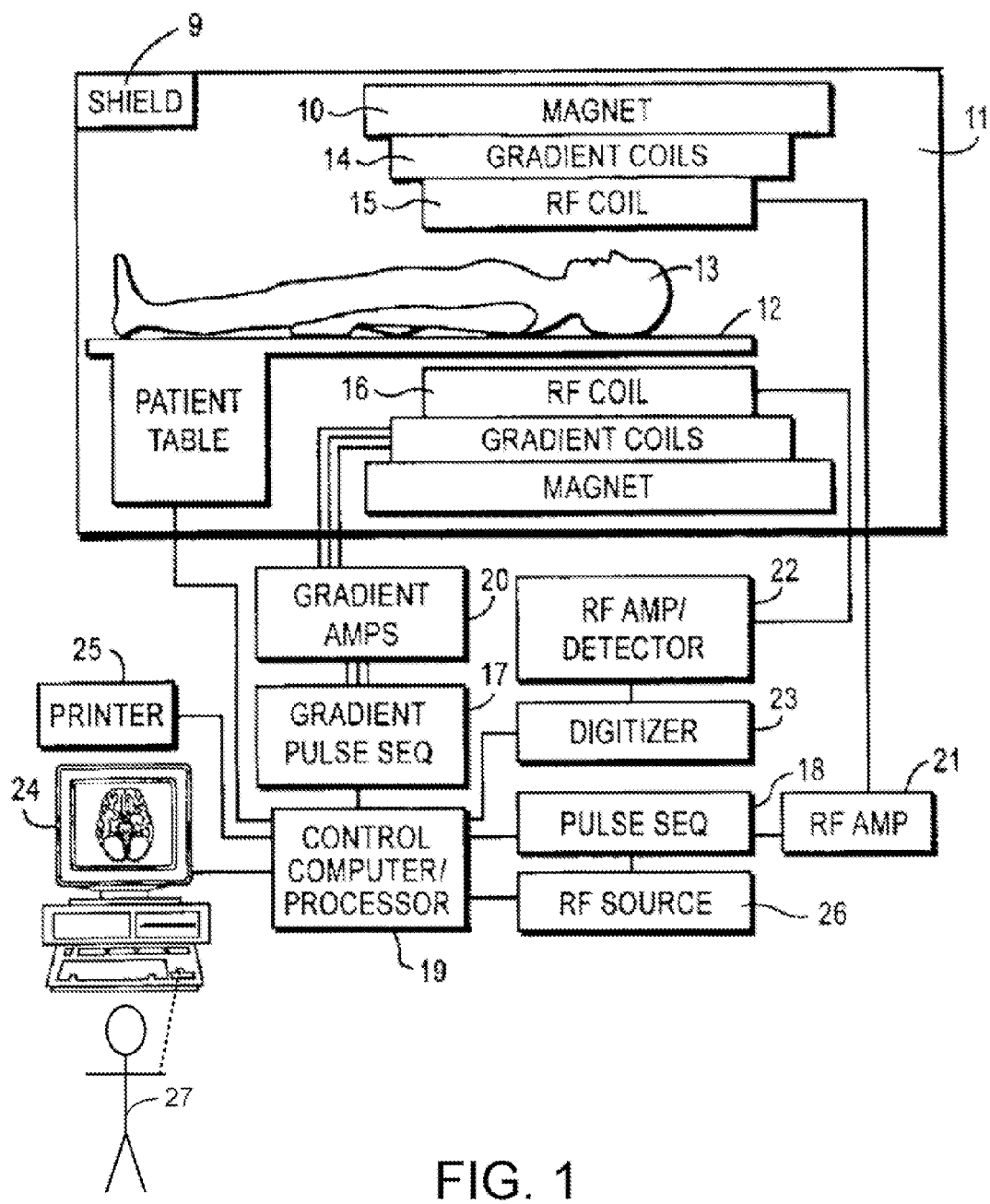
FIG. 1 is a schematic diagram of an MRI system.

As shown in FIG. 1, an MRI system typically includes a magnet 10 to impose a static magnetic field ($B_0$) on an object 13, gradient coils 14 for imposing spatially distributed physical gradient magnetic fields ($G_x$, $G_y$, $G_z$) along three respective orthogonal directions, and RF coils 15 and 16 to transmit and receive RF signals to and from selected nuclei of the object being imaged. The object 13 lies on a movable table 12 such that a portion of the object to be imaged is moved into an "imaging volume" 11 between the magnet and coils, which defines a field of view (FOV) of the MRI system.

To acquire MRI data, the MRI system generates magnetic gradient and RF nutation pulses via MRI pulse sequence controllers 17 and 18 under the control of programmable computer/processor 19. In addition, processor 19 controls gradient pulse amplifier 20 and RF source 26 and amplifier circuits 21 and 22. The MR signal (RF detector) circuits 22 are suitably interfaced with MR signal RF coils 16 located within the shielded MRI system gantry 9. The received MR responses are digitized by digitizer 23 and passed to processor 19 which may include an array processor or the like for image processing and suitable computer program storage media (not shown) wherein programs are stored and selectively utilized so as to control the acquisition and processing of MR signal data and to produce image displays on a CRT of control terminal 24 operated by a human user 27. The MRI system control terminal 24 may include suitable keyboard switches and the like for exerting operator control over the computer 19. Images may also be recorded directly on film or on other suitable media by printing device 25.

The MR image so generated is influenced by the selected imaging mode and parameters of the imaging sequence. For any particular application, these parameters are optimized according to the object being examined and the underlying mechanisms that provide the desired image contrast.

Figure 2:
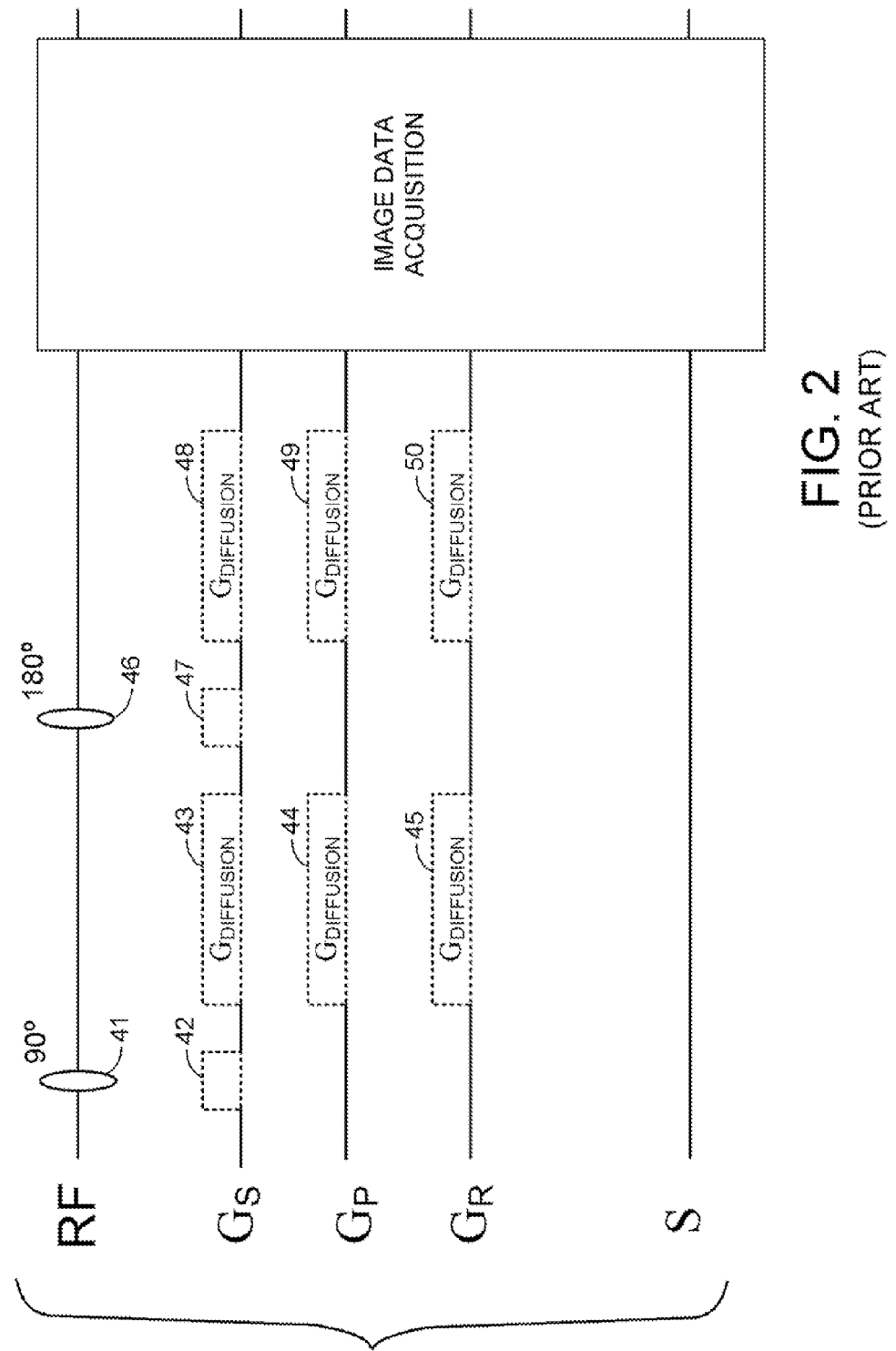
FIG. 2 shows a block diagram for diffusion-weighted MRI using the MRI system of FIG. 1.
Figure 3:
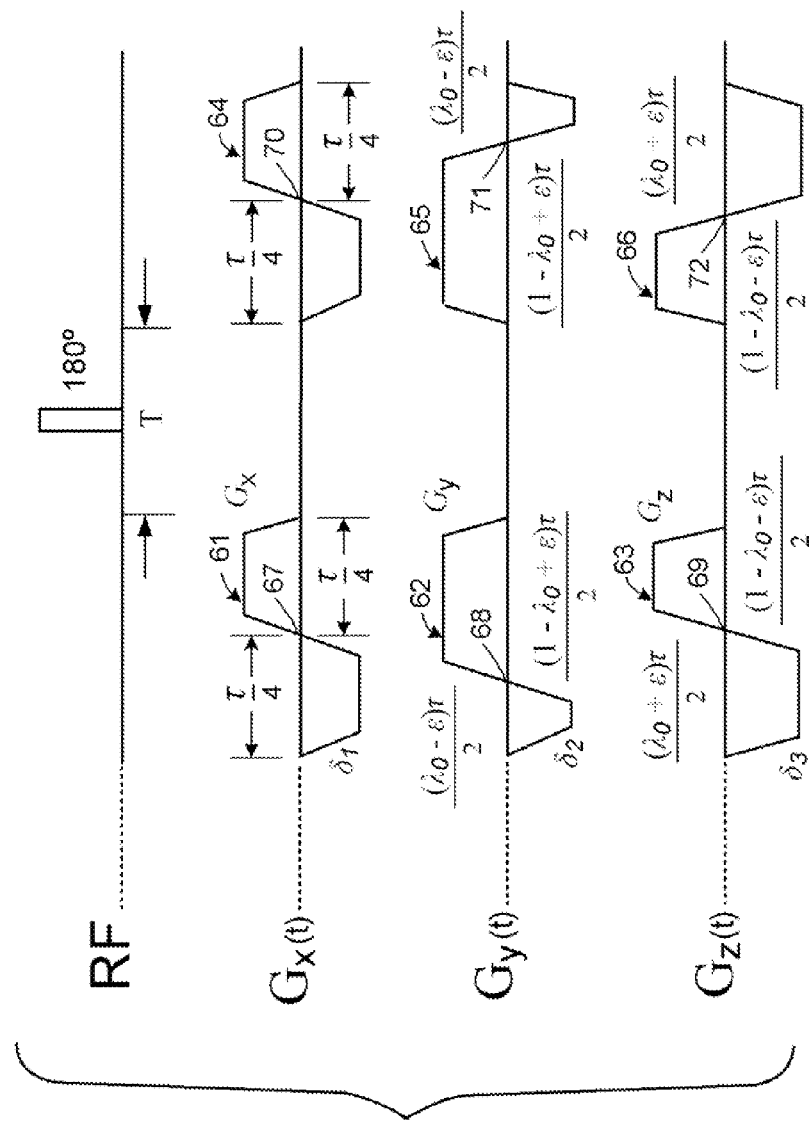
FIG. 3 shows a motion-probing gradient template in accordance with an aspect of the present invention.

By using motion-probing gradient (MPG) pulses, magnetic resonance (MR) images can be acquired with contrast sensitive to molecular self-diffusion. FIG. 2 shows an exemplary prior art MPG gradient pulse pattern applied in an echo planar imaging sequence. FIG. 3 shows one of the possible embodiments of the current invention without any specific imaging process applied following the diffusion weighting. The sequence of FIG. 2 includes a 90 degree slice-selective RF pulse 31 applied at the same time as a slice selection gradient pulse 42. Thereafter a first MPG pattern having components 43, 44, and 45 is applied along three orthogonal directions, respectively. Then a 180 degree RF refocusing pulse 46 is applied together with a slice selection gradient pulse 47. Thereafter, a second MPG pattern having components 48, 49, 50 is applied along the same three orthogonal directions for components 43, 44, and 45, respectively. There follows an imaging process to spatial-encode and record an MRI signal from the object for producing a magnetic resonance image from the object. The excitation, isotropic diffusion weighting, and signal detection in FIG. 2 is repeated as many times as required by the imaging process for spatial encoding in order to produce the desired magnetic resonance image of the object.

As shown, FIG. 2 represents prior art. By inserting patterns 61, 62, and 63 of FIG. 3 in place of patterns 43, 44, and 45 and inserting patterns 64, 65, and 66 of FIG. 3 in place of patterns 48, 49, and 50 one has a new sequence that is capable of single-shot isotropic diffusion weighted MRI. An imaging sequence using the MPG patterns of FIG. 3 can be any of a variety of kinds, such as conventional spin-echo (SE), stimulated-echo (STE), fast-spin-echo (FSE), spiral scan, or echo planar imaging (EPI). Such imaging sequences can use various kinds of imaging processes for producing one dimensional, two dimensional, or three dimensional magnetic resonance images of the object.

As introduced above, there are some applications where it is desired to select an MPG pattern in order to obtain isotropic diffusion weighting in a single scan. The selection process takes into consideration how the MR signal is attenuated due to diffusion caused by the MPG pattern, in an attempt to equalize the signal attenuation along each of three orthogonal directions and to eliminate signal attenuation due to cross-term diffusion.

In general, the signal attenuation due to diffusion generated by MPG over a time period of [0, τ] is given by:

$$S(\tau) = S(0)e^{-b \cdot D}$$

where b and D are diffusion weighting factor and diffusion tensor, respectively, as given by:

$$b = \begin{bmatrix} b_{xx} & b_{xy} & b_{xz} \\ b_{yx} & b_{yy} & b_{yz} \\ b_{zx} & b_{zy} & b_{zz} \end{bmatrix} \quad D = \begin{bmatrix} D_{xx} & D_{xy} & D_{xz} \\ D_{yx} & D_{yy} & D_{yz} \\ D_{zx} & D_{zy} & D_{zz} \end{bmatrix}$$

$$b \cdot D = \Sigma (b_{ij})(D_{ij}) (i,j=x,y,z)$$

$$b_{ij} = \int_0^\tau k_i(t) k_j(t) dt \quad (i, j = x, y, z)$$

$$b_{xy} = b_{yx}, b_{xz} = b_{zx}, b_{yz} = b_{zy}$$

$$k_i(t) = \int_0^t \gamma G_i(t') dt' \quad (i = x, y, z)$$

where G represents magnetic fiend gradient, and γ is the gyromagnetic ratio of the nuclei.

When the following conditions are satisfied, isotropic diffusion weighting is achieved:

$$b_{xy} = b_{xz} = b_{yz} = 0$$

$$b_{xx} = b_{yy} = b_{zz} = \frac{b_{iso}}{3}$$

where $b_{iso}$ is the isotropic diffusion weighting factor.

We then have:

$$S(\tau) = S(0)e^{-(b_{xx}D_{xx}+b_{yy}D_{yy}+b_{zz}D_{zz})} = S(0)e^{-b_{iso}\frac{Tr[D]}{3}}$$

Based on the above conditions and consideration of various factors, the MPG pattern is chosen to follow the template shown in FIG. 3 in order to achieve single scan isotropic diffusion weighting with optimal efficiency. Though the template is shown in conjunction with spin-echo formation by a central 180 degree RF pulse, it should be understood easily by anyone skilled in the art of MRI that the template can also be used in other types of imaging sequences, such as stimulated-echo sequences. For example, two successive 90 degree RF pulses could be substituted for the central 180 degree RF pulse 46 shown in FIG. 3 for stimulated-echo imaging sequences. In addition, the orthogonal directions (x, y, z) of the motion-probing gradient components ($G_x$, $G_y$, $G_z$) can be chosen to be aligned with any particular ones of the orthogonal gradient magnetic fields ($G_S$, $G_P$, $G_R$) for slice selection, phase-encoding, and read-out, respectively. In other words, the motion-probing pattern component $G_X$ of FIG. 3 could be used for the diffusion portions of any one of the three orthogonal gradient magnetic field components ($G_S$, $G_P$, $G_R$) shown FIG. 2, and the motion-probing pattern components $G_y$, $G_z$ could be used, respectively, for the diffusion portions of the other two of the three orthogonal gradient magnetic field components ($G_S$, $G_P$, $G_R$). Alternatively, the orthogonal directions (x, y, z) of the motion-probing gradient components ($G_x$, $G_y$, $G_z$) can be selected independently from the directions selected for imaging. For example, the motion-probing gradient components can be aligned along the magnet coordinate directions, which imaging can use oblique directions.

The template in FIG. 3 has one sequence parameter (T) that is the time duration separating a first MPG cycle (61, 62, 63) and a second MPG cycle (64, 65, 66) for each axis (x, y, z). For example, when the motion-probing pattern component $G_x$ of FIG. 3 is used for the diffusion portions 43 and 48 of the gradient magnetic field component $G_s$ of FIG. 2, the first MPG cycle 61 occurs during the first diffusion portion 43 and the second MPG cycle 64 occurs during the second diffusion portion 48. τ is the total duration of diffusion weighting, and each MPG cycle (61, 62, 63, 64, 65, 66) has a duration of ½τ.

In the motion-probing pattern component $G_x$, the first cycle 61 has two lobes of opposite polarity that are symmetrical about a common mid-point 67, and the second cycle 64 also has two lobes of opposite polarity that are symmetrical about a common mid-point 70. The second cycle 64 is substantially identical to the first cycle 61 shifted in time by the duration T+½τ.

In the motion-probing pattern component $G_y$, the first cycle 62 has two lobes of opposite polarity about a crossing point 68, and the second cycle 65 also has two lobes of opposite polarity about a crossing point 71. The second cycle 65 is substantially identical to the first cycle 63 inverted or flipped in time and shifted in time by the duration T+½τ.

In the motion-probing pattern component $G_z$, the first cycle 63 has two lobes of opposite polarity about a crossing point 69, and the second cycle 66 also has two lobes of opposite polarity about a crossing point 72. The second cycle 66 is substantially identical to the first cycle 63 inverted or flipped in time and shifted in time by the duration T+½τ.

The template has one constant ($\lambda_0$) and five variables ($G_x$, $G_y$, $G_z$, τ, ε). The template also has three slew times ($\delta_x$, $\delta_y$, $\delta_z$), one for each of the three orthogonal gradient directions ($G_x$, $G_y$, $G_z$). $\lambda_0$ is a constant that is selected to facilitate the calculations for achieving optimal efficiency of the gradient pattern. $\lambda_0$ ranges from 0 to 1 and specifies the arithmetic mean time of the midpoints 68 and 69 with respect to the period ½τ of each cycle. $\lambda_0$ ranges from 0 to 1, and specifies the arithmetic mean time of the crossing points 68 and 69. For a value of $\lambda_0$=½, the arithmetic mean time of the crossing points 68 and 69 is the time of the midpoint 67.

ε specifies an amount of skew between the gradient cycles 62 and 63. More precisely, ε specifies a shift in the time of the crossing point 68 forward in time by an amount (ε)(½τ) from the arithmetic mean time of the crossing points 68 and 69, and a corresponding shift in the time of the crossing point 69 backwards in time by the same amount (ε)(½τ) from the arithmetic mean time of the crossing points 68 and 69. Thus the crossing point 69 occurs after the crossing point 68 by an amount (ε)(τ).

In practice, τ is determined in joint consideration of echo-time (TE) and desired value of $b_{iso}$. ε is selected by an optimization procedure to minimize cross-terms in b (i.e., $b_{xy}$, $b_{xz}$, $b_{yz}$). $G_x$, $G_y$, and $G_z$ are determined after the pattern is already optimized simply to obtain the desired $b_{iso}$.

Values of T, τ and ($\delta_x$, $\delta_y$, $\delta_z$) are set according to the imaging sequence for which the gradient pattern is employed. T is the time between the end of the first gradient pattern and the beginning of the second gradient pattern in the gradient template shown in FIG. 3. In case of a conventional spin-echo sequence, this time period is necessary to perform spin refocusing. In the case of a stimulated echo sequence, this time period starts sometime before the beginning of the $2^{nd}$ 90 pulse and ends sometime after the end of the $3^{rd}$ 90 pulse.

τ is the time duration that the imaging sequence provides for carrying out diffusion weighting. This time is mostly tied to the echo-time (TE).

$\delta_x$, $\delta_y$, $\delta_z$ are the slew times used for gradient switching. The lengths of $\delta_x$, $\delta_y$, $\delta_z$ are set based on sequence and system considerations.

Figure 4:
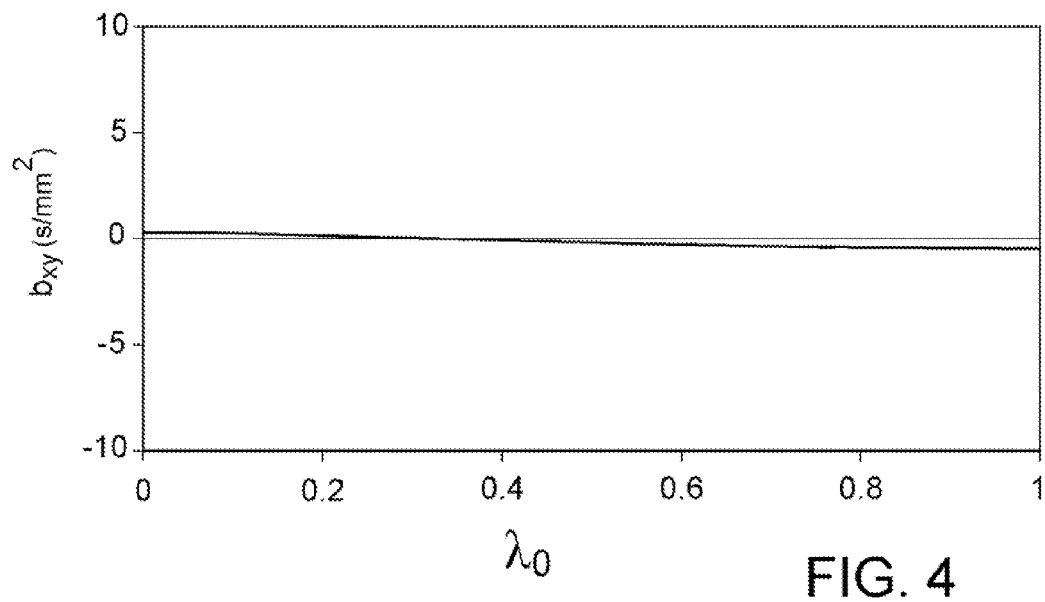
FIG. 4 is a graph of a diffusion weighting factor $b_{xy}$ as a function of a parameter $\lambda_0$ of the gradient template in FIG. 3.

By virtue of symmetry, the gradient pattern template of FIG. 3 always produces negligible $b_{xy}$ and $b_{xz}$, regardless of other parameters used in the template. For example, FIG. 4 shows $b_{xy}$ in units of s/mm² as a function of $\lambda_0$ for the case of T=6 ms, τ=60 ms, $\delta_x=\delta_y=\delta_z$=1 ms, and ε=0.

$\lambda_0$ is used for optimization of efficiency. The value of $\lambda_0$ can be set empirically so that it does not need to be searched during on-the-fly calculation. Instead of searching the value of $\lambda_0$, a value is pre-selected that produces optimal efficiency of diffusion weighting. The best efficiency is the one that produces the maximum $b_{iso}^{max}$. As one example, a full search of optimal $\lambda_0$, with T varying from 2.0 ms to 10.0 ms and slew from 0.5 ms to 1.5 ms, found values limited to the range of 0.35 and 0.39. 0.37 is selected as the value of $\lambda_0$ based on the search.

Figure 5:
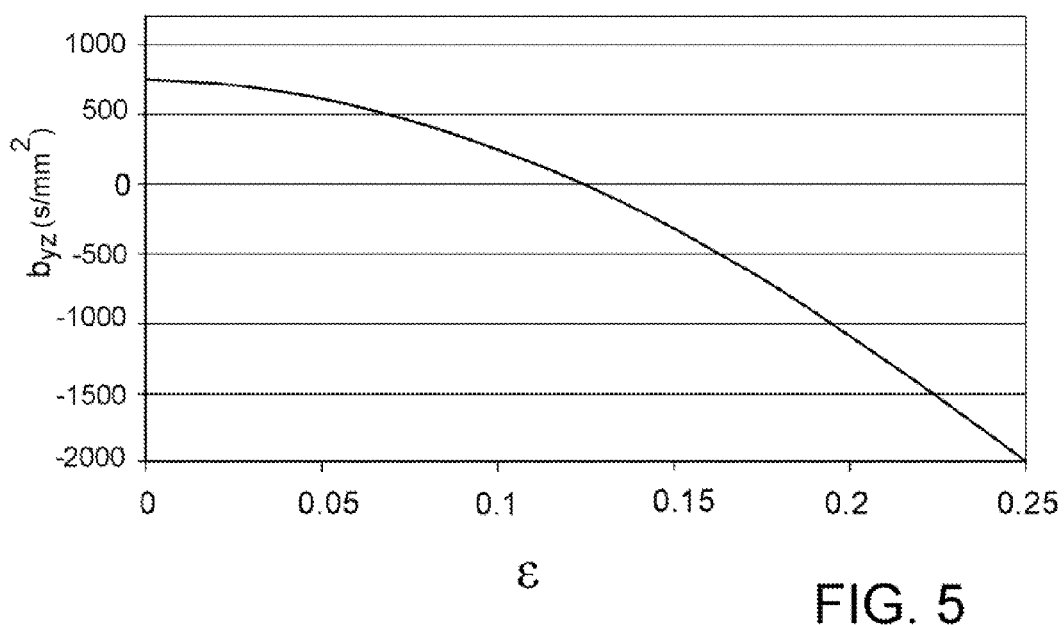
FIG. 5 is a graph of a diffusion weighting factor $b_{yz}$ as a function of a skew parameter $\epsilon$ of the gradient template in FIG. 3.

The process of optimization is then reduced to searching for value of ε that produces minimal $b_{yz}$. As shown in FIG. 5, $b_{yz}$ varies significantly monotonically with ε (for the case of T=6 ms, ε=60 ms, $\delta_x=\delta_y=\delta_z$=1 ms and $\lambda_0$=0.3). Thus a simple procedure can be used to search for the optimal value of ε.

Figure 6:
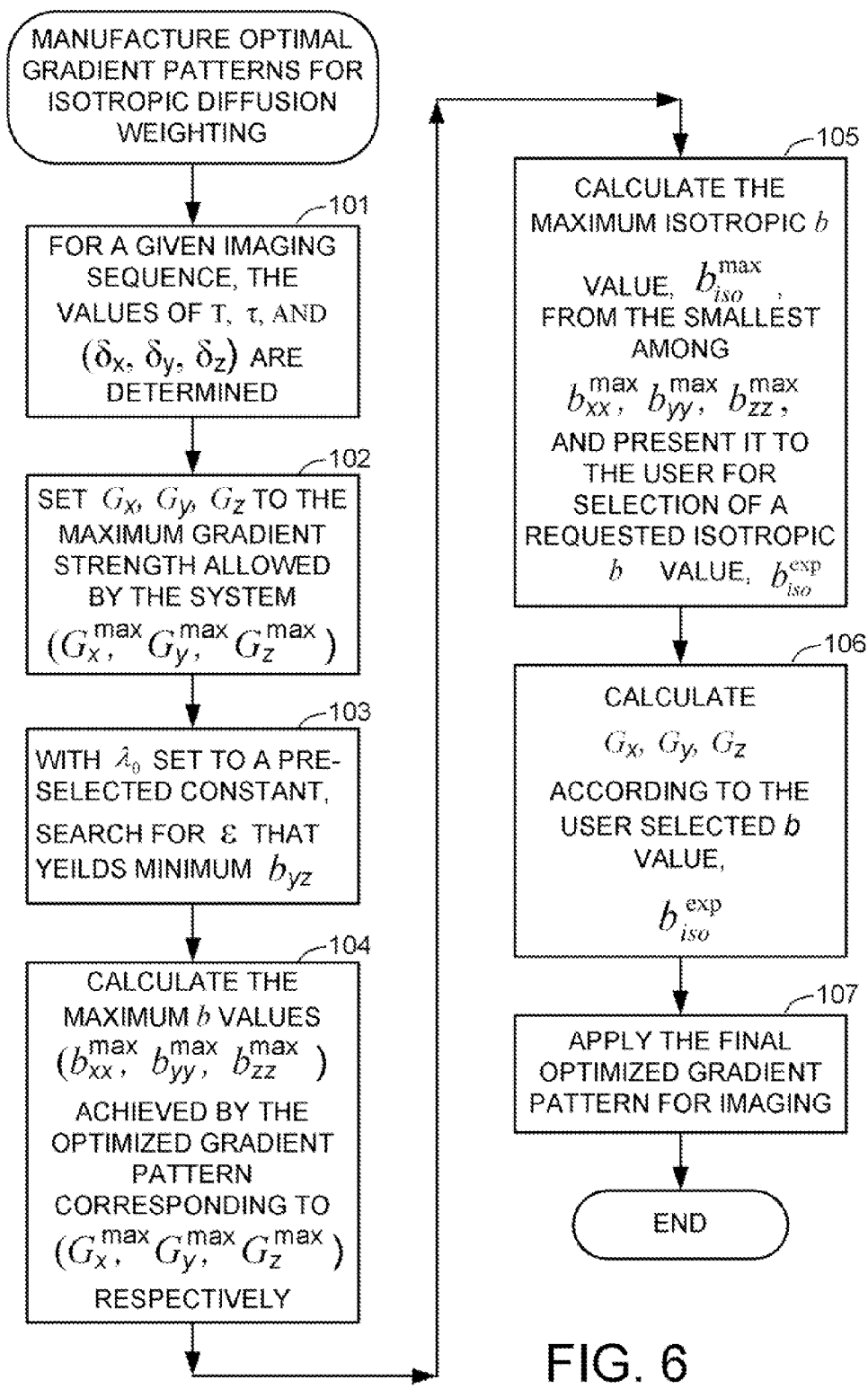
FIG. 6 is a flowchart of a procedure for manufacturing an optimal gradient pattern for isotropic diffusion weighting by selecting specific parameters of the gradient template in FIG. 3.

FIG. 6 shows a general procedure for manufacturing an optimal gradient pattern for isotropic diffusion weighting from the template of FIG. 3. This procedure includes calculations that could be performed by the computer 19 in FIG. 1. In a first step 101, for a given imaging sequence, the values of T, τ and ($\delta_x$, $\delta_y$, $\delta_z$) are determined. At least the value of τ could be user-adjustable, either directly or indirectly by changing TE, so that the user (27 in FIG. 1) could obtain the desired maximum value for isotropic diffusion weighting, $b_{iso}^{max}$, that is calculated and presented by the presently described invention. Next, in step 102, the gradient amplitudes $G_x$, $G_y$, $G_z$ are set to respective maximum gradient strengths ($G_x^{max}$, $G_y^{max}$, $G_z^{max}$) allowed by the system hardware.

In step 103, with $\lambda_0$ set to a preselected constant, a search is conducted for a value of ε that yields minimum $b_{yz}$. In step 104, maximum b values, $b_{xx}^{max}$, $b_{yy}^{max}$, $b_{zz}^{max}$, are calculated that are achieved by the above optimized gradient pattern corresponding to $G_x^{max}$, $G_y^{max}$, $G_z^{max}$, respectively. In step 105, the maximum isotropic b value, $b_{iso}^{max}$, is calculated from the smallest among $b_{xx}^{max}$, $b_{yy}^{max}$, $b_{zz}^{max}$, and it is presented to the user 27 of the MRI system of FIG. 1 for selection of a requested isotropic b value, $b_{iso}^{exp}$. In step 106, the gradient amplitudes $G_x$, $G_y$, $G_z$ are calculated according to the user selected b value, $b_{iso}^{exp}$. Finally, in step 107, the final optimized gradient pattern is applied by the MRI system of FIG. 1 for imaging of the object with isotropic diffusion weighting in a single scan.

Figure 7:
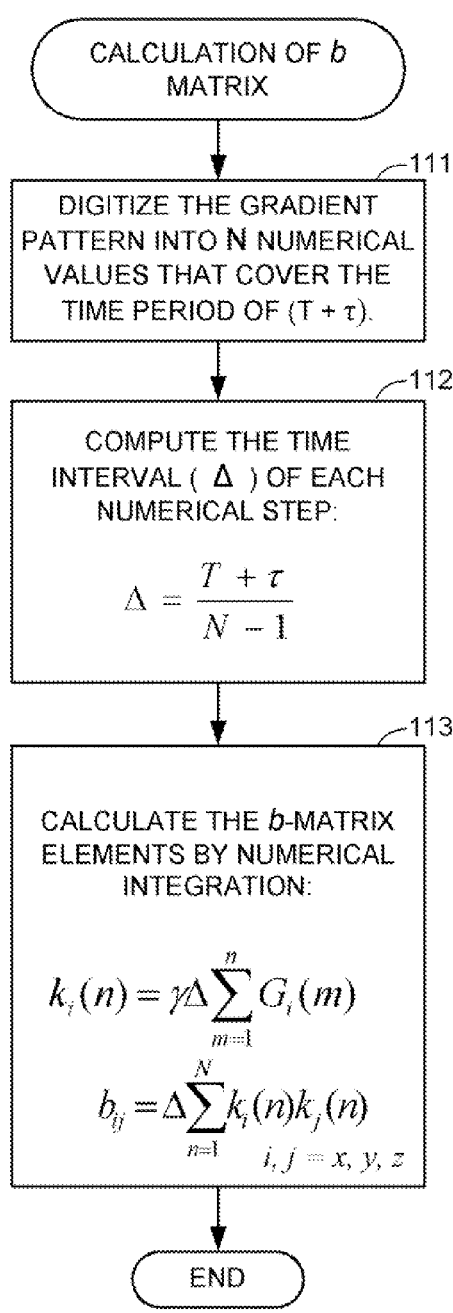
FIG. 7 is a flowchart of a procedure for calculating a diffusion weighting factor matrix by numerical integration.

FIG. 7 shows the calculation of the b matrix. In a first step 111, the gradient pattern is digitized into "N" numerical values (for each of the three gradient channels ($G_x$, $G_y$, $G_z$) that cover the time period of (T+τ). Next, in step 112, the time interval Δ of each numerical step is computed as:

$$\Delta = \frac{T + \tau}{N - 1}$$

Finally, in step 113, the b-matrix elements are calculated by numerical integration:

$$k_i(n) = \gamma \Delta \sum_{m=1}^{n} G_i(m) \quad (i = x, y, z)$$

$$b_{ij} = \Delta \sum_{n=1}^{N} k_1(n) k_j(n) \quad (i, j = x, y, z)$$

where γ is the gyromagnetic ratio of the nuclei.

Figure 8:
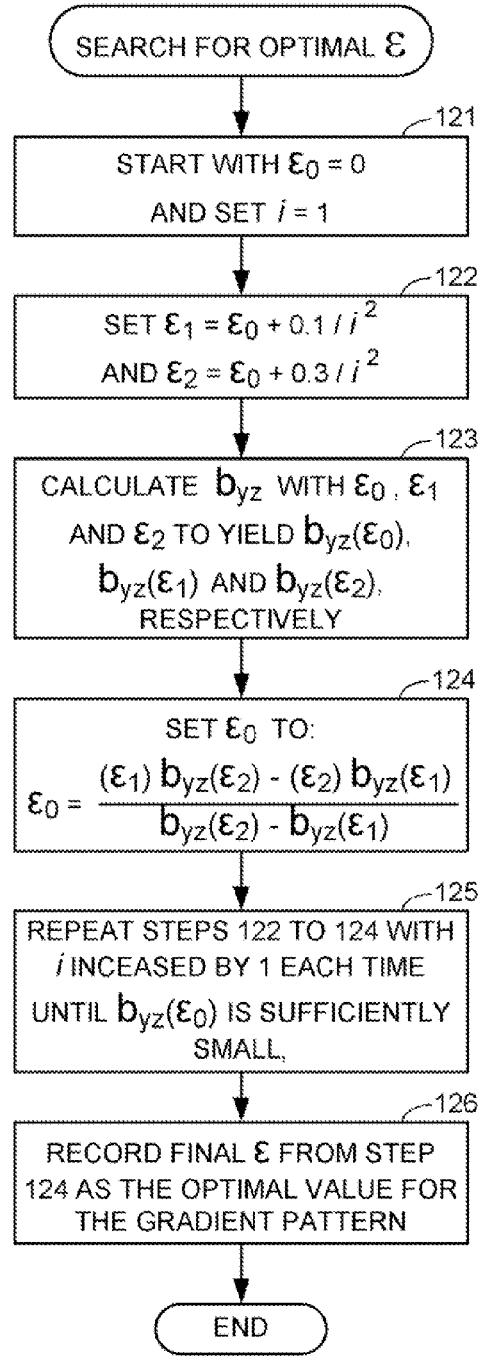
FIG. 8 is a flowchart of a procedure for searching for an optimal value for the skew parameter $\epsilon$ of the gradient template in FIG. 3.

FIG. 8 shows the search for the optimal value of ε. In a first step 121, a parameter $\epsilon_0$ initially is set to 0, and a parameter i initially is set to 1. In step 122, the processor sets $\epsilon_1=\epsilon_0+0.1/i^2$ and $\epsilon_2=\epsilon_0+0.3/i^2$. In step 123, $b_{yz}$ is calculated with $\epsilon_0$, $\epsilon_1$ and $\epsilon_2$ to yield $b_{yz}(\epsilon_0)$, $b_{yz}(\epsilon_1)$ and $b_{yz}(\epsilon_2)$, respectively. In step 124, is set to: $\epsilon_0=(b_{yz}(\epsilon_2)\cdot\epsilon_1-b_{yz}(\epsilon_1)\cdot\epsilon_2)/(b_{yz}(\epsilon_2)-b_{yz}(\epsilon_1))$. In step 125, steps 122 to 124 are repeated with i increased by one each time until $b_{yz}(\epsilon_0)$ is sufficiently small. In the last step 126, the value of $\epsilon_0$ computed in step 124 during the final iteration is recorded as the optimal $\epsilon$ value for the gradient pattern.

Figure 9:
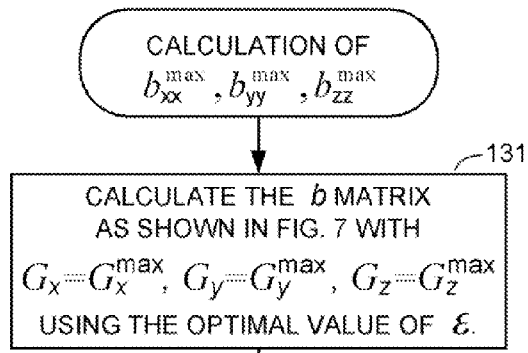
FIG. 9 is a flowchart of a procedure for calculation of maximum values of the diffusion weighting factors $b_{xx}$, $b_{yy}$, and $b_{zz}$.

FIG. 9 shows the calculation of $b_{xx}^{max}$, $b_{yy}^{max}$, and $b_{zz}^{max}$. In step 131, $b_{xx}^{max}$, $b_{yy}^{max}$, and $b_{zz}^{max}$ calculated using the method of FIG. 7 with $G_x=G_x^{max}$, $G_y=G_y^{max}$, $G_z=G_z^{max}$ and $\epsilon$ set to the optimum value determined by the procedure in FIG. 8.

Figure 10:
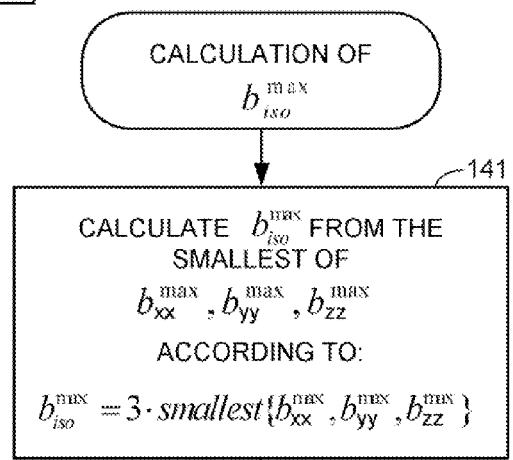
FIG. 10 is a flowchart of a procedure for calculating a maximum isotropic value of the diffusion weighting.

FIG. 10 shows the calculation of $b_{iso}^{max}$. In step 141: $b_{iso}^{max}$ is calculated from the smallest of $b_{xx}^{max}$, $b_{yy}^{max}$, $b_{zz}^{max}$ according to:

$$b_{iso}^{max}=3\cdot\text{smallest}\{b_{xx}^{max},b_{yy}^{max},b_{zz}^{max}\}$$

Figure 11:
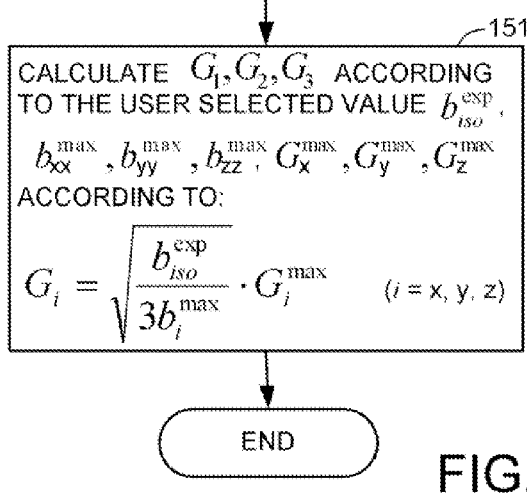
FIG. 11 is a flowchart of a procedure for calculating amplitudes for components of a gradient pattern following the gradient template in FIG. 3.

FIG. 11 shows the calculation of $G_x$, $G_y$, and $G_z$. In step 151, $G_x$, $G_y$, and $G_z$ are calculated according to the user selected value, $b_{iso}^{exp}$, and $b_{xx}^{max}$, $b_{yy}^{max}$, $b_{zz}^{max}$, $G_x^{max}$, $G_y^{max}$, $G_z^{max}$ according to:

$$G_i = \sqrt{\frac{b_{iso}^{exp}}{3b_i^{max}}} \cdot G_i^{max} \quad (i=x,y,z)$$

The following is a specific example. Assuming $G_x^{max}=G_y^{max}=G_z^{max}=17000$ Hz/cm, T=6 ms, $\tau=80$ ms, $\delta_x=\delta_y=\delta_z=1$ ms and $\lambda_0=0.37$, the procedure described above produced optimized $\epsilon$ of 0.114 and $b_{iso}^{max}$ of 759 s/mm$^2$.

In view of the above, there have been described simple and efficient methods and procedures for manufacturing gradient patterns in-situ for isotropic diffusion weighting during magnetic resonance imaging. These procedures can be used during the imaging of an object for adjustment and real-time optimization of the sequence parameters to produce gradient patterns with desired characteristics to improve the magnetic resonance images of the object.

BROAD SCOPE OF THE INVENTION

While illustrative embodiments of the invention have been described herein, the present invention is not limited to the various preferred embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." In this disclosure and during the prosecution of this application, means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited. In this disclosure and during the prosecution of this application, the terminology "present invention" or "invention" may be used as a reference to one or more aspect within the present disclosure. The language present invention or invention should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features. In this disclosure, the following abbreviated terminology may be employed: "e.g." which means "for example."

What is claimed is:

1. A method of magnetic resonance imaging of an object comprising the steps of:
   (a) placing the object in a magnetic bias field and applying radio-frequency (RF) excitation to the object to excite nuclear spins in the object; and then
   (b) applying a first motion-probing magnetic field gradient pattern to the object; and then
   (c) applying at least one radio-frequency (RF) refocusing pulse to the object to refocus the excited nuclear spins; and then
   (d) applying a second motion-probing magnetic field gradient pattern to the object; and then
   (e) applying an imaging process to spatial-encode and record a magnetic resonance signal from the object for producing a magnetic resonance image of the object; and
   (f) repeating steps (b) to (e) as many times as required by the imaging process to produce the magnetic resonance image of the object;
   wherein the second motion-probing magnetic field gradient pattern is symmetrical with respect to the first motion-probing magnetic field gradient pattern, and the first and second magnetic field gradient patterns follow a template characterized by a skew parameter ($\epsilon$), and wherein the first and second motion-probing magnetic field gradient patterns are selected for single-scan isotropic diffusion weighting by calculating in real time an optimum value of the skew parameter ($\epsilon$) as a function of determined values of other parameters of the imaging sequence of steps (b) to (e).

2. The method as claimed in claim 1 which further includes using the optimum value of the skew parameter ($\epsilon$) for calculating a maximum isotropic value of a diffusion weighting factor, and presenting the maximum isotropic value of the diffusion weighting factor to a human user for selection of a requested isotropic value of the diffusion weighting factor, calculating amplitudes of the first and second motion-probing magnetic field gradient patterns from the requested isotropic diffusion weighting factor, and applying to the object the first and second motion-probing magnetic field gradient patterns having the calculated amplitudes.

3. The method as claimed in claim 1, which further includes a human user adjusting at least one of said determined values of other parameters of the imaging sequence of steps (b) to (e) so as to obtain a maximum isotropic value of the diffusion weighting factor that is capable of accommodating a requested isotropic value of the diffusion weighting factor.

4. The method as claimed in claim 1, wherein the sequence parameters include a parameter (T) specifying a duration of time between the first motion-probing magnetic field gradient pattern and the second motion-probing magnetic field gradient pattern, a parameter (τ) specifying a duration of time of the first motion-probing magnetic field gradient pattern and the second motion-probing magnetic field gradient pattern, and at least one slew rate parameter (δ).

5. The method as claimed in claim 1, wherein the first motion-probing magnetic field gradient pattern includes a first component along a first direction, a second component along a second direction, and a third component along a third direction, wherein the first, second and third directions are orthogonal to each other, and the second motion-probing magnetic field gradient pattern has a first component along the first direction, a second component along the second direction, and a third component along the third direction, wherein the first component of the second motion-probing magnetic field gradient pattern is substantially identical to the first component of the first motion-probing magnetic field gradient pattern shifted in time, the second component of the second motion-probing magnetic field gradient pattern is substantially identical to the second component of the first motion-probing magnetic field gradient pattern inverted in time and shifted in time, and the third component of the second motion-probing magnetic field gradient pattern is substantially identical to the third component of the first motion-probing magnetic field gradient pattern inverted in time and shifted in time.

6. The method as claimed in claim 5, wherein each component of each of the first and second motion-probing magnetic field gradient patterns has a single cycle of two lobes of opposite polarity about a crossing point.

7. The method as claimed in claim 6, wherein the skew parameter (ε) specifies a difference in time between the crossing points of the second component and the third component of the first motion-probing magnetic field gradient pattern.

8. The method as claimed in claim 6, wherein each of the single cycles has substantially the same period, and the crossing point of the first component of the first motion-probing magnetic field gradient pattern is a mid-point of the single cycle of the first component of the first motion-probing magnetic field gradient pattern.

9. A method of magnetic resonance imaging of an object comprising the steps of:
  (a) placing the object in a magnetic bias field and applying radio-frequency (RF) excitation to the object to excite nuclear spins in the object; and then
  (b) applying a first motion-probing magnetic field gradient pattern to the object; and then
  (c) applying at least one radio-frequency (RF) refocusing pulse to the object to refocus the excited nuclei spins; and then
  (d) applying a second motion-probing magnetic field gradient pattern to the object; and then
  (e) applying an imaging process to spatial-encode and record a magnetic resonance signal from the object for producing a magnetic resonance image of the object; and
  (f) repeating steps (b) to (e) as many times as required by the imaging process to produce the magnetic resonance image of the object;
  wherein the first motion-probing magnetic field gradient pattern includes a first component along a first direction, a second component along a second directions and a third component along a third direction, wherein the first, second, and third directions are orthogonal to each other, and the second motion-probing magnetic field gradient pattern has a first component along the first direction, a second component along the second direction, and a third component along the third direction, wherein the first component of the second motion-probing magnetic field gradient pattern is substantially identical to the first component of the first motion-probing magnetic field gradient pattern shifted in time, the second component of the second motion-probing magnetic field gradient pattern is substantially identical to the second component of the first motion-probing magnetic field gradient pattern inverted in time and shifted in time, and the third component of the second motion-probing magnetic field gradient pattern is substantially identical to the third component of the first motion-probing magnetic field gradient pattern inverted in time and shifted in time;
  wherein each component of each of the first and second motion-probing magnetic field gradient patterns has a single cycle of two lobes of opposite polarity about a crossing point;
  wherein each of the single cycles has substantially the same period, and the crossing point of the first component of the first motion-probing magnetic field gradient pattern is a mid-point of the single cycle of the first component of the first motion-probing magnetic field gradient pattern;
  wherein the method includes adjusting a skew parameter (ε) for isotropic diffusion weighting, wherein the skew parameter (ε) specifies a difference in time between the crossing point of the second component of the first motion-probing magnetic field gradient pattern and the crossing point of the third component of the first motion-probing magnetic field gradient pattern.

10. The method as claimed in claim 9, which further includes using the adjusted value of the skew parameter (ε) for calculating a maximum isotropic value of a diffusion weighting factor, and presenting the maximum isotropic value of the diffusion weighting factor to a human user for selection of a requested isotropic value of the diffusion weighting factor, calculating amplitudes of the first and second motion-probing magnetic field gradient patterns from the requested isotropic diffusion weighting factor, and applying to the object the first and second motion-probing magnetic field gradient patterns having the calculated amplitudes.

11. A system for magnetic resonance imaging of an object, the system comprising, in combination:
  a magnet for applying a magnetic bias field to the object;
  at least one radio-frequency (RF) coil for radio-frequency (RF) coupling with the object at a magnetic resonance frequency;
  gradient coils for applying a first motion-probing magnetic field gradient pattern to the object prior to application of at least one radio-frequency (RF) refocusing pulse to the object and for applying a second motion-probing magnetic field gradient pattern to the object after the application of said at least one radio-frequency (RF) refocusing pulse to the object;
  a radio-frequency (RF) source and power amplifier connected to the at least one radio-frequency (RF) coil for applying radio-frequency (RF) pulses to the object;
  a gradient amplifier connected to the gradient coils for exciting the gradient coils;

a radio-frequency (RF) amplifier connected to the at least one radio-frequency (RF) coil for amplifying a magnetic resonance signal from magnetic resonance in the object; and a control computer connected to the radio-frequency (RF) source and the gradient amplifier for controlling the radio-frequency (RF) source and the gradient amplifier, and connected to the radio-frequency (RF) amplifier for recording the magnetic resonance signal;

wherein the control computer is programmed for computing a magnetic resonance image of the object from the recorded magnetic resonance signal, and for adjusting the motion-probing magnetic field gradient patterns so that the second motion-probing magnetic field gradient pattern is symmetrical with respect to the first motion-probing magnetic field gradient pattern and the first and second motion-probing magnetic field gradient patterns follow a template characterized by a skew parameter ($\epsilon$), and wherein the control computer is programmed for isotropic diffusion weighting by calculating in real time an optimum value of the skew parameter ($\epsilon$) as a function of determined values of other parameters of an imaging sequence in which the motion-probing magnetic field gradient patterns are applied.

12. The system as claimed in claim 11, wherein the control computer is further programmed for using the optimum value of the skew parameter ($\epsilon$) for calculating a maximum isotropic value of a diffusion weighting factor, and presenting the maximum isotropic value of the diffusion weighting factor to a human user for selection of a requested isotropic value of the diffusion weighting factor, and for calculating amplitudes of the first and second motion-probing magnetic field gradient patterns from the requested isotropic diffusion weighting factor, and for applying to the object the first and second motion-probing magnetic field gradient patterns having the calculated amplitudes.

13. The system as claimed in claim 11, wherein said other parameters of the imaging sequence include a parameter (T) specifying a duration of time between the first motion-probing magnetic field gradient pattern and the second motion-probing magnetic field gradient pattern, a parameter ($\tau$) specifying a duration of time of the first motion-probing magnetic field gradient pattern and the second motion-probing magnetic field gradient pattern, and at least one slew rate parameter ($\delta$).

14. The system as claimed in claim 11, wherein the first motion-probing magnetic field gradient pattern includes a first component along a first direction, a second component along a second direction, and a third component along a third direction, wherein the first, second, and third directions are orthogonal to each other, and the second motion-probing magnetic field gradient pattern has a first component along the first direction, a second component along the second direction, and a third component along the third direction, wherein the first component of the second motion-probing magnetic field gradient pattern is substantially identical to the first component of the first motion-probing magnetic field gradient pattern shifted in time, the second component of the second motion-probing magnetic field gradient pattern is substantially identical to the second component of the first motion-probing magnetic field gradient pattern inverted in time and shifted in time, and the third component of the second motion-probing magnetic field gradient pattern is substantially identical to the third component of the first motion-probing magnetic field gradient pattern inverted in time and shifted in time.

15. The system as claimed in claim 14, wherein each component of each of the first and second motion-probing magnetic field gradient patterns has a single cycle of two lobes of opposite polarity about a crossing point.

16. The system as claimed in claim 15, wherein the skew parameter ($\epsilon$) specifies a difference in time between the crossing points of the second component and the third component of the first motion-probing magnetic field gradient pattern.

17. The system as claimed in claim 15, wherein each of the single cycles has substantially the same period and the crossing point of the first component of the first motion-probing magnetic field gradient pattern is a mid-point of the single cycle of the first component of the first motion-probing magnetic field gradient pattern.

18. A system for magnetic resonance imaging of an object, the system comprising, in combination:

a magnet for applying a magnetic bias field to the object;

at least one radio-frequency (RF) coil for radio-frequency (RF) coupling with the object at a magnetic resonance frequency;

gradient coils for applying a first motion-probing magnetic field gradient pattern to the object prior to application of at least one radio-frequency (RF) refocusing pulse to the object and for applying a second motion-probing magnetic field gradient pattern to the object after the application of said at least one radio-frequency (RF) refocusing pulse to the object;

a radio-frequency (RF) source and power amplifier connected to the at least one radio-frequency (RF) coil for applying radio-frequency (RF) pulses to the object;

a gradient amplifier connected to the gradient coils for exciting the gradient coils;

a radio-frequency (RF) amplifier connected to the at least one radio-frequency (RF) coil for amplifying a magnetic resonance signal from magnetic resonance in the object; and a control computer connected to the radio-frequency (RF) source and the gradient amplifier for controlling the radio-frequency (RF) source and the gradient amplifier, and connected to the radio-frequency (RF) amplifier for recording the magnetic resonance signal;

wherein the control computer is programmed for computing a magnetic resonance image of the object from the recorded magnetic resonance signal and for adjusting the motion-probing magnetic field gradient patterns so that the first motion-probing magnetic field gradient pattern includes a first component along a first direction, a second component along a second direction, and a third component along a third direction, wherein the first, second, and third directions are orthogonal to each other, and the second motion-probing magnetic field gradient pattern has a first component along the first direction, a second component along the second direction, and a third component along the third direction, wherein the first component of the second motion-probing magnetic field gradient pattern is substantially identical to the first component of the first motion-probing magnetic field gradient pattern shifted in time, the second component of the second motion-probing magnetic field gradient pattern is substantially identical to the second component of the first motion-probing magnetic field gradient pattern inverted in time and shifted in time, and the third component of the second motion-probing magnetic field gradient pattern is substantially identical to the third component of the first motion-probing magnetic field gradient pattern inverted in time and shifted in time;

wherein each component of each of the first and second motion-probing magnetic field gradient patterns has a single cycle of two lobes of opposite polarity about a crossing point;

wherein each of the single cycles has substantially the same period, and the crossing point of the first component of the first motion-probing magnetic field gradient pattern is a mid-point of the single cycle of the first component of the first motion-probing magnetic field gradient pattern;

wherein the control computer is programmed for adjusting a skew parameter ($\epsilon$) for isotropic diffusion weighting, wherein the skew parameter ($\epsilon$) specifies a time shift of the second component of the first motion-probing magnetic field gradient pattern towards an earlier time point from the mid-point of the first motion-probing magnetic field gradient pattern and a time shift of the third component of the first motion-probing magnetic field gradient pattern towards a later time from the mid-point of the first motion-probing magnetic field gradient pattern.

19. The system as claimed in claim 18, wherein the control computer is further programmed for using the adjusted value of the skew parameter ($\epsilon$) for calculating a maximum isotropic value of a diffusion weighting factor, and presenting the maximum isotropic value of the diffusion weighting factor to a human user for selection of a requested isotropic value of the diffusion weighting factor, calculating amplitudes of the first and second motion-probing magnetic field gradient patterns from the requested isotropic diffusion weighting factor, and applying to the object the first and second motion-probing magnetic field gradient patterns having the calculated amplitudes.

20. The system as claimed in claim 18, wherein the control computer is programmed for computing an optimum value of the skew parameter ($\epsilon$) for isotropic diffusion weighting from given values of sequence parameters that include a parameter (T) specifying a duration of time between the first motion-probing magnetic field gradient pattern and the second motion-probing magnetic field gradient pattern, a parameter ($\tau$) specifying a duration of time of the first motion-probing magnetic field gradient pattern and the second motion-probing magnetic field gradient pattern, and at least one slew rate parameter ($\delta$).

* * * * *